(12) United States Patent
Chang et al.

(10) Patent No.: US 10,347,524 B2
(45) Date of Patent: Jul. 9, 2019

(54) TRENCH ISOLATION STRUCTURES AND METHODS FOR FORMING THE SAME

(71) Applicant: Vanguard International Semiconductor Corporation, Hsinchu (TW)

(72) Inventors: Hsiung-Shih Chang, Taichung (TW); Jui-Chun Chang, Hsinchu (TW); Li-Che Chen, Hsinchu (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 2 days.

(21) Appl. No.: 15/262,694

(22) Filed: Sep. 12, 2016

(65) Prior Publication Data

US 2018/0076288 A1 Mar. 15, 2018

(51) Int. Cl.
*H01L 21/74* (2006.01)
*H01L 21/762* (2006.01)

(52) U.S. Cl.
CPC ...... *H01L 21/76229* (2013.01); *H01L 21/743* (2013.01)

(58) Field of Classification Search
CPC .... H01L 21/823878; H01L 2027/1189–11892; H01L 21/043; H01L 21/0485; H01L 29/45–458; H01L 51/105; H01L 21/768–76898; H01L 23/52–53295
See application file for complete search history.

(56) References Cited

U.S. PATENT DOCUMENTS

| 6,166,441 | A | * | 12/2000 | Geryk | H01L 23/5226 257/773 |
| 2009/0090992 | A1 | * | 4/2009 | Lerner | H01L 21/76264 257/506 |
| 2015/0349055 | A1 | * | 12/2015 | Tokumitsu | H01L 29/0692 257/401 |

FOREIGN PATENT DOCUMENTS

| TW | 201322447 A1 | 6/2013 |
| TW | 201508920 A | 3/2015 |
| TW | 201541589 A | 11/2015 |
| TW | 201546911 A | 12/2015 |
| TW | 201546992 A | 12/2015 |
| TW | 201601283 A | 1/2016 |

* cited by examiner

*Primary Examiner* — Moazzam Hossain
*Assistant Examiner* — Stanetta D Isaac
(74) *Attorney, Agent, or Firm* — Birch, Stewart, Kolasch & Birch, LLP

(57) ABSTRACT

A trench isolation structure is provided. The trench isolation structure includes a substrate. A polygonal trench is disposed in the substrate. An insulating material is disposed in the polygonal trench, and a polygon top-side contact structure is disposed in the polygonal trench and surrounded by the insulating material. The polygon top-side contact structure has the same shape as the polygonal trench from a top view. A method for forming the trench isolation structure is also provided.

19 Claims, 11 Drawing Sheets

TRENCH ISOLATION STRUCTURES AND METHODS FOR FORMING THE SAME

BACKGROUND

Field of the Invention

The present invention relates to semiconductor technology, and in particular to a trench isolation structure having a top-side contact structure and methods for forming the same.

Description of the Related Art

In semiconductor devices, in order to prevent interference, deep trench isolation (DTI) structures and an insulating layer in a substrate may be used to form a closed isolation region which electrically isolates the internal devices and the external devices. When bias or ground needs to be applied to the above isolation region, a bottom-side contact structure or a top-side contact structure is usually formed in the substrate.

However, in the conventional art, both the bottom-side contact structure and the top-side contact structure need additional photomasks to define the position of a contact hole to be filled with a contact structure.

BRIEF SUMMARY

In some embodiments of the disclosure, a trench isolation structure is provided. The trench isolation structure includes a substrate, a polygonal trench disposed in the substrate, and an insulating material disposed in the polygonal trench. The trench isolation structure also includes a polygon top-side contact structure disposed in the polygonal trench and surrounded by the insulating material, wherein the polygon top-side contact structure has the same shape as the polygonal trench from a top view.

In some embodiments of the disclosure, a method for fabricating a trench isolation structure is provided. The method includes providing a substrate, forming a polygonal trench in the substrate, and forming an insulating material in the polygonal trench. The method also includes forming a polygon top-side contact structure in the polygonal trench and surrounded by the insulating material, wherein the polygon top-side contact structure has the same shape as the polygonal trench from a top view.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIGS. 3A-3H shows cross sections of various stages of a method of forming a trench isolation structure according to some embodiments of the disclosure, wherein FIG. 3H shows a cross section of a trench isolation structure, along line A-A' shown in FIG. 2, according to some embodiments of the disclosure.

DETAILED DESCRIPTION OF THE INVENTION

Figure 1:
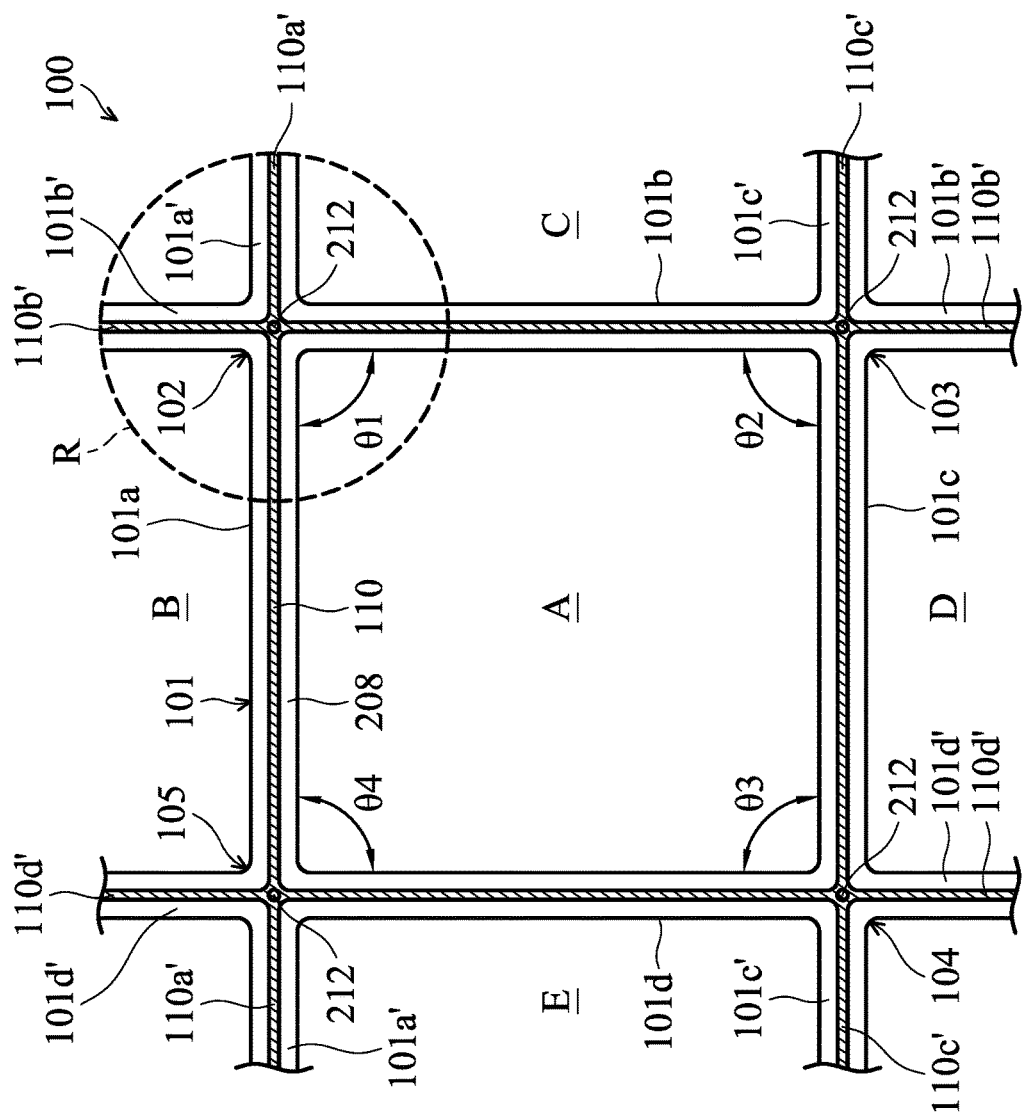
FIG. 1 shows a plan view of a trench isolation structure according to some embodiments of the disclosure.

The following description is about methods for trench isolation structures and methods for forming the same according to embodiments of the disclosure. However, it should be appreciated that the embodiments of the disclosure provide lots of suitable concepts of the invention and can be performed in a wide variety of specific backgrounds. The specific embodiments of the disclosure are used to explain the fabrication by specific methods and use of the invention and should not be taken in a limiting sense. The scope of the invention is best determined by reference to the appended claims. Moreover, the same or similar elements in the drawings and the description are labeled with the same reference numbers.

FIG. 1 shows a plan view of a trench isolation structure 100 according to some embodiments of the disclosure. In FIG. 1, the trench isolation structure 100 includes a polygonal trench 101. The polygonal trench 101 has a large aspect ratio (for example: the aspect ratio is larger than 10), and an insulating material 208 fills the polygonal trench 101 to form a deep trench isolation (DTI) structure.

The polygonal trench 101 has multiple sides and multiple angles enclosed by adjacent sides. In the embodiment, the polygonal trench 101 is a closed rectangle trench formed by a first side 101a, a second side 101b, a third side 101c and a fourth side 101d. The first side 101a and the adjacent second side 101b connect at a vertex 102, and the first side 101a and the adjacent second side 101b encloses an angle $\theta_1$. The second side 101b and the adjacent third side 101c connect at a vertex 103, and the second side 101b and the adjacent third side 101c encloses an angle $\theta_2$. The third side 101c and the adjacent fourth side 101d connect at a vertex 104, and the third side 101c and the adjacent fourth side 101d encloses an angle $\theta_3$. The fourth side 101d and the adjacent first side 101a connect at a vertex 105, and the fourth side 101d and the adjacent first side 101a encloses an angle $\theta_4$. In some embodiments, the lengths of the first side 101a, the second side 101b, the third side 101c and the fourth side 101d are the same, and the angles $\theta_1$, $\theta_2$, $\theta_3$ and $\theta_4$ are all 90 degrees. In some other embodiments, the first side 101a, the second side 101b, the third side 101c and the fourth side 101d may have different lengths, and the angles $\theta_1$, $\theta_2$, $\theta_3$ and $\theta_4$ are from 60 degrees to 120 degrees.

The trench isolation structure 100 further includes a polygon top-side contact structure 110. The polygon top-side contact structure 110 fills in the polygonal trench 101 and is surrounded by the insulating material 208. From a top view, the polygon top-side contact structure 110 has the same shape as the polygonal trench 101. In other words, the polygon top-side contact structure 110 fills in the first side 101a, the second side 101b, the third side 101c and the fourth side 101d and the vertex 102, 103, 104 and 105 of the polygonal trench 101 to form a closed rectangle with the same shape as the polygonal trench 101. In some embodiments, the material of the polygon top-side contact structure 110 may include W, Po or another suitable conductive material.

As shown in FIG. 1, the trench isolation structure 100 further includes a via 212 disposed in a dielectric layer on the polygon top-side contact structure 110, and the via 212 is located at the vertex 102 (or the vertices 103, 104 or 105)

of the polygon of the polygon top-side contact structure 110. In some embodiments, the material of the via 212 includes W, Po or another suitable conductive material. In some embodiments, the material of the via 212 may include Ag, Cu or another suitable conductive material. In some embodiments, the material of the via 212 may be same as the material of the polygon top-side contact structure 110.

As shown in FIG. 1, in the top view, the trench isolation structure 100 further includes a trench protruding portion 101a' extended from the vertices 102 and 105 of the polygonal trench 101 and along an extending direction of the first side 101a of the polygonal trench 101 to extend outwardly. A trench protruding portion 101b' is extended from the vertices 102 and 103 of the polygonal trench 101 and along an extending direction of the second side 101b of the polygonal trench 101 to extend outwardly. A trench protruding portion 101c' is extended from the vertices 103 and 104 of the polygonal trench 101 and along an extending direction of the third side 101c of the polygonal trench 101 to extend outwardly. A trench protruding portion 101d' is extended from the vertices 104 and 105 of the polygonal trench 101 and along an extending direction of the fourth side 101d of the polygonal trench 101 to extend outwardly. In some embodiments, the trench isolation structure 100 also includes top side contact protruding portions 110a', 110b', 110c' and 110d' filling the trench protruding portions 101a', 101b', 101c' and 101d', respectively.

An area surrounded by the closed rectangle trench formed by the first side 101a, the second side 101b, the third side 101c and the fourth side 101d of the polygonal trench 101 may include a semiconductor element area A. With the insulating material 208 filling the polygonal trench 101 and the trench protruding portions 101a', 101b', 101c' and 101d', the trench isolation structure 100 can electrically isolate the semiconductor element area A and other semiconductor element areas B, C, D and E. In some embodiments, elements in the semiconductor element areas A, B, C, D and E may have different applied biases. In some embodiments, elements in the semiconductor element areas A, B, C, D and E may include various low-voltage, high-voltage, and extreme high-voltage elements such as a metal oxide semiconductor field effect transistor (MOSFET), a high electron mobility transistor (HEMT), an insulated gate bipolar transistor (IGBT), etc.

In conventional trench isolation structures, the applied bias to semiconductor elements in an area and the applied bias to other semiconductor elements in another area separated by the trench would be affected by each other. This causes a bias coupling phenomenon, and the operation of the semiconductor elements in every area is thereby affected.

Compared to conventional trench isolation structures, in the embodiments of the disclosure, the trench isolation structure 100 further includes the polygon top-side contact structure 110. By applying 0 volts to the polygon top-side contact structure 110 (i.e. the polygon top-side contact structure 110 is grounded), the bias coupling phenomenon caused by elements in the semiconductor element areas A, B, C, D and E can be prevented. Namely, the effect of a bias coupling immune is achieved, and the semiconductor device can thereby have a higher figure of merit (FOM).

It should be appreciated that the rectangle trench shown in FIG. 1 merely presents some embodiments of the disclosure, but it is not limited thereto. For example, in some embodiments, the polygonal trench 101 may have the shape of a triangle, pentagon, hexagon or another suitable polygon, and the polygon top-side contact structure 110 may also have the same shape as a triangle, pentagon, hexagon or another suitable polygon.

Figure 2:
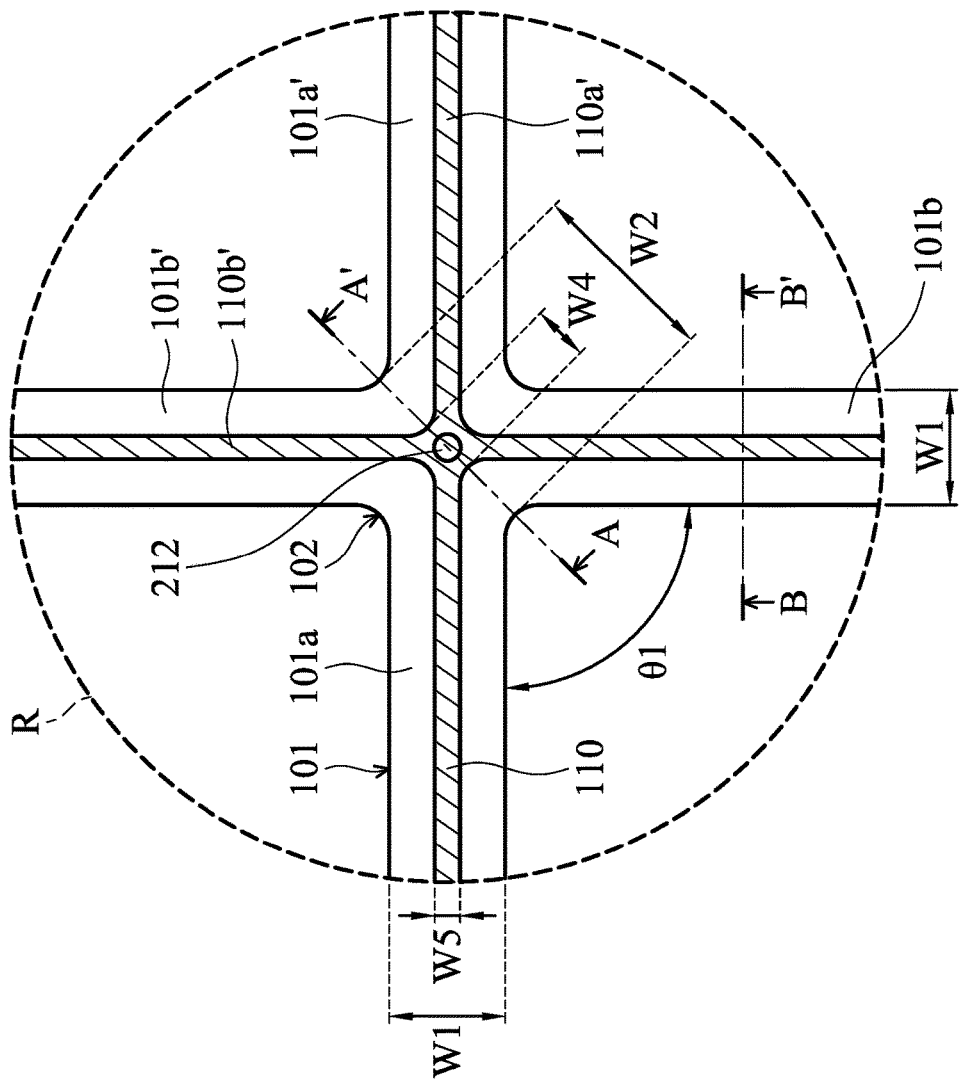
FIG. 2 shows an enlarged view of the region R of FIG. 1.

Referring to FIG. 2, it shows an enlarged view of the region R of FIG. 1. In some embodiments, the first side 101a and the second side 101b of the polygonal trench 101 have a side width W1, and the center through the vertex 102 of the first side 101a and the second side 101b has a diagonal width W2. Since the angle $\theta_1$ enclosed by the first side 101a and the second side 101b in the embodiment is 90 degrees, the diagonal width W2 should be 1.414 times the side width W1 according to calculation using trigonometric functions. In addition, because of a corner rounding effect caused by an etching process, the trench width at the vertex 102 of the first side 101a and the second side 101b is widened. Thus, the diagonal width W2 is greater than 1.414 times the side width W1. In other embodiments, the first side 101a and the second side 101b may have different side widths, and a different diagonal width is obtained according to the different side widths.

Furthermore, in some embodiments, the width W4 at the vertex 102 (or other vertices 103, 104, 105) of the polygon top-side contact structure 110 that fills the polygonal trench 101 is different from the width W5 at the first side 101a (or other sides 101b, 101c, 101d) of the polygon top-side contact structure 110.

FIGS. 3A-3H show cross sections of various stages of a method of forming a trench isolation structure 100 according to some embodiments of the disclosure. FIGS. 3A-3H show a cross section along line A-A' shown in FIG. 2.

Figure 3A:
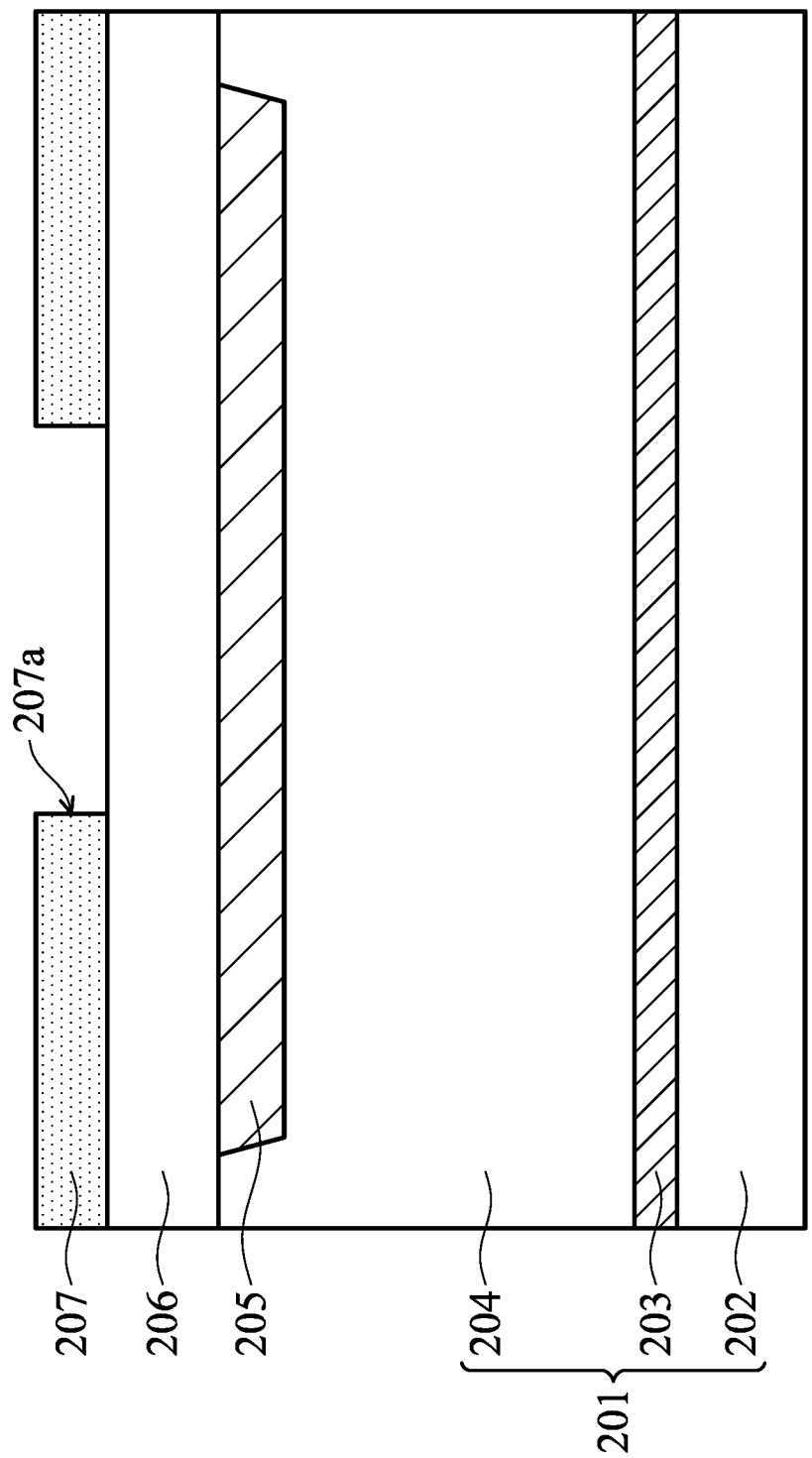

In FIG. 3A, a substrate 201 is provided. The substrate 201 includes a first semiconductor layer 202, an insulating layer 203 formed on the first semiconductor layer 202 and a second semiconductor layer 204 formed on the insulating layer 203. In some embodiments, the first semiconductor layer 202 and the second semiconductor layer 204 may include silicon, germanium, silicon germanium, group III-V material (for example, gallium arsenide, indium arsenide), group II-VI material (for example, zinc selenide, zinc sulfide) or another suitable semiconductor material and may be formed by an epitaxial grown process or other methods. In some embodiments, the insulating layer 203 may include buried oxide (BOX) and may be formed by an ion implantation process and an annealing process.

In some embodiments, a shallow trench isolation structure 205 is formed in the second semiconductor layer 204 by a lithography process, an etching process (for example, a dry-etching process, wet-etching process, plasma-etching process, reactive ion etching process or another suitable process), a deposition process (for example, a physical vapor deposition process, a chemical vapor deposition process or another suitable process) and a planarization process (for example, a chemical mechanical polishing process or another suitable process). Then, a first dielectric layer 206 is formed on the second semiconductor layer 204 and the shallow trench isolation structure 205 by a deposition process (for example, a physical vapor deposition process, a chemical vapor deposition process or another suitable process). The shallow trench isolation structure 205 adjoins the first dielectric layer 206. Then, a patterned mask 207 with an opening 207a is formed on the first dielectric layer 206 by a lithography process including photoresist coating (for example, spin-coating), soft baking, mask aligning, exposing, post-exposure baking, photoresist developing, washing and drying (for example, hard baking), another suitable patterning process or a combination thereof. In the embodiment, the shallow trench isolation structure 205 is in direct contact with the first dielectric layer 206. In some embodiments, the shallow trench isolation structure 205 and the first dielectric layer 206 may include oxide, nitride, carbide or another suitable dielectric material or a combination thereof.

Figure 3B:
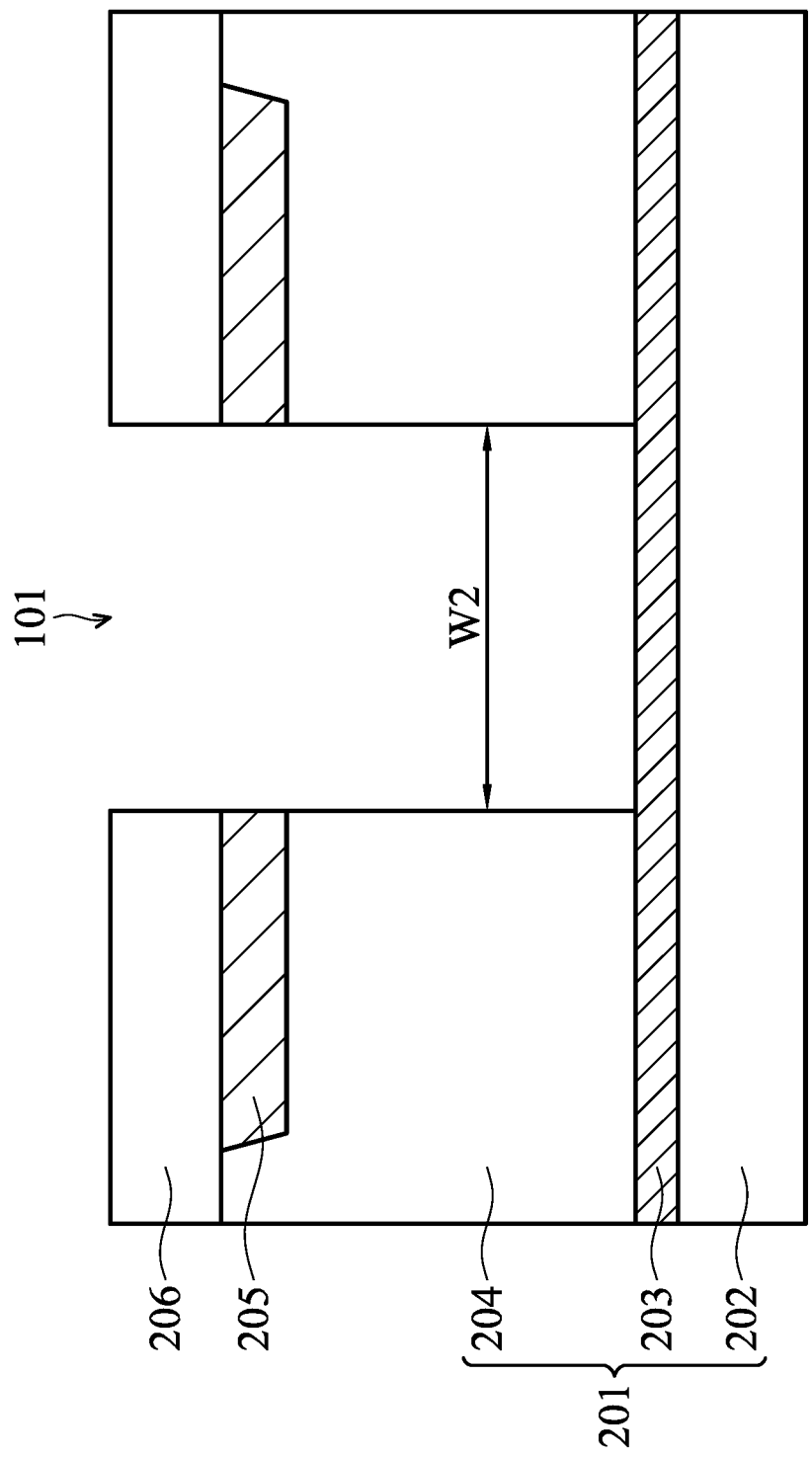

Referring to FIGS. 3A-3B, performing an etching process (for example, a dry-etching process, wet-etching process, plasma-etching process, reactive ion etching process or another suitable process) on the first dielectric layer 206, the shallow trench isolation structure 205 and the second semiconductor layer 204 by using the patterned mask 207 to form the polygonal trench 101 in the second semiconductor layer 204 at a location corresponding to the opening 207a. The polygonal trench 101 has a diagonal width W2 at its vertex. After the polygonal trench 101 is formed, the patterned mask 207 is removed. In some embodiments, the polygonal trench 101 penetrates the first dielectric layer 206, the shallow trench isolation structure 205 and the second semiconductor layer 204, and the polygonal trench 101 does not penetrate the underlying first semiconductor layer 202 and the insulating layer 203. In some embodiments, since the etching process may be a reactive ion etching (RIE), a polygonal trench 101 with a larger aspect ratio can be formed, which is advantageous in subsequently forming the deep trench isolation structure.

Figure 3C:
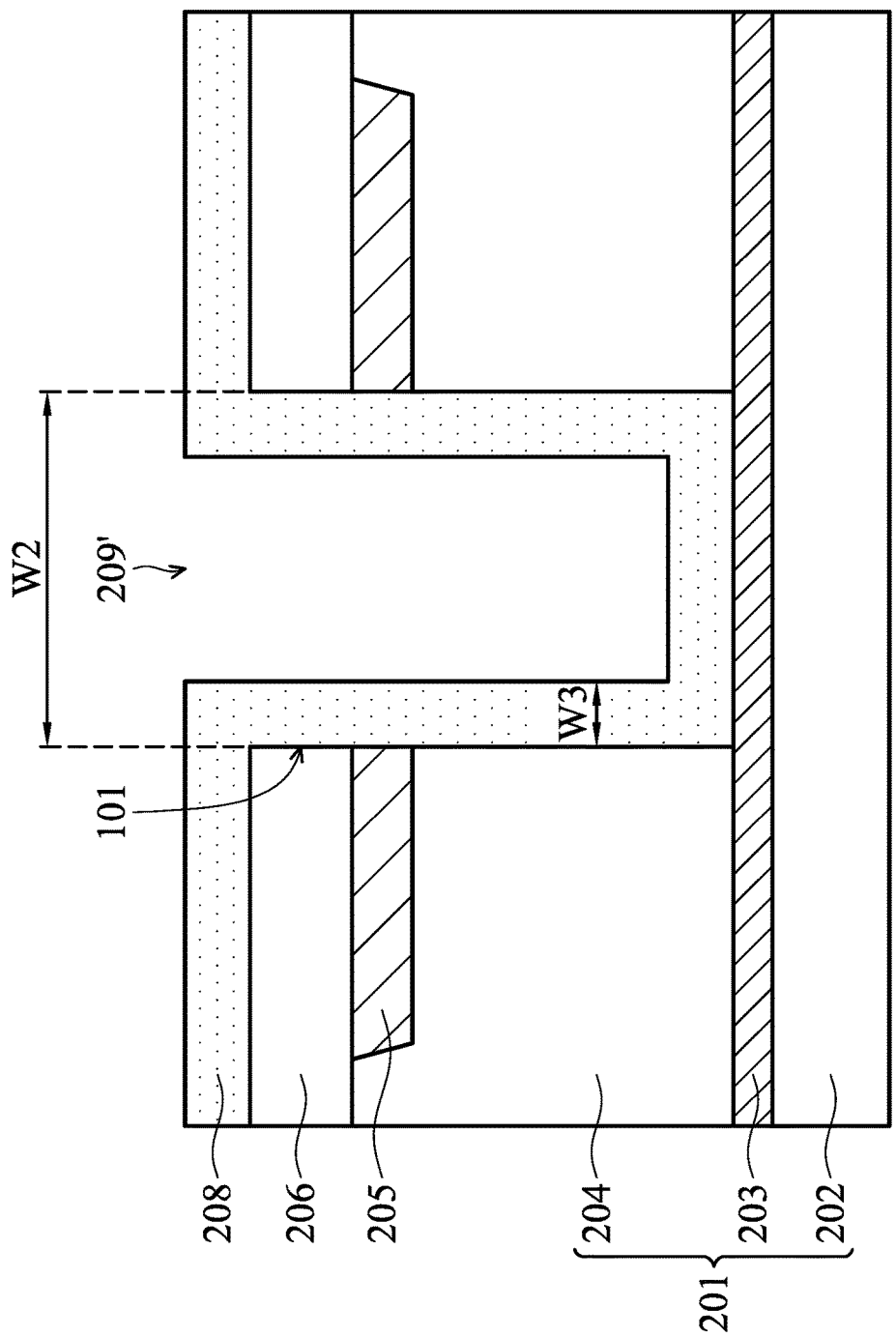

Referring to FIG. 3C, after the polygonal trench 101 is formed, the insulating material 208 is conformally deposited on a surface of the first dielectric layer 206 and sidewalls and a bottom of the polygonal trench 101. The insulating material 208 has a thickness W3. In some embodiments, the material of the insulating material 208 may include inorganic material (for example, silicon oxide, silicon nitride, silicon oxynitride or a combination thereof), organic material (for example, epoxy, polyimide, butylcyclobutene (BCB), parylene, polynaphthalenes, fluorocarbons, acrylates) or another suitable insulating material.

In the embodiment, the polygonal trench 101 is not completely filled by the insulating material 208. Therefore, an opening 209' is formed at the center of the polygonal trench 101. The opening 209' corresponds to a location where a top-side contact structure is formed in a subsequent process.

By controlling the deposition thickness W3 of the insulating material 208, the polygonal trench 101 is not completely filled by the insulating material 208. Therefore, the opening 209' and a contact hole subsequently formed at the location of the opening 209' are self-aligned to form at the center of the polygonal trench 101 without using additional photomasks. In order to fill the polygon top-side contact structure 110 in the polygonal trench 101 successfully in a subsequent process by making the polygonal trench 101 not completely filled by the insulating material 208, a ratio W3:W1 of the thickness W3 of the insulating material 208 to the width W1 of the polygonal trench 101 must be maintained within a certain range. In some embodiments, the ratio W3:W1 of the thickness W3 of the insulating material 208 to the width W1 of the polygonal trench 101 is 2:5. In some embodiments, the thickness W3 of the insulating material 208 is greater than 1 μm, and the insulating material 208 has a voltage resistance that is greater than 400V.

Figure 3D:
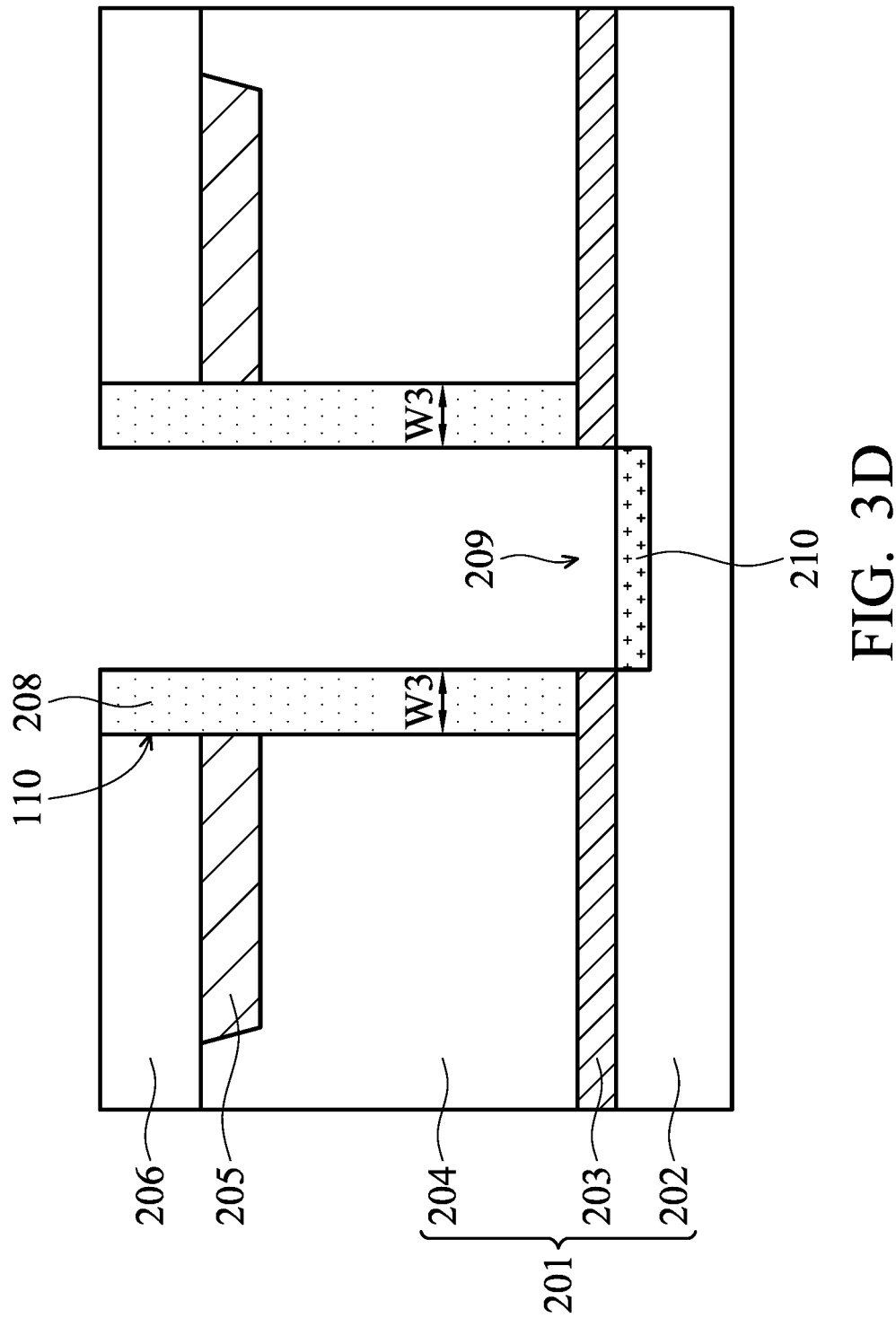

Referring to FIG. 3D, after the insulating material 208 is formed, the first dielectric layer 206 is used as a etch stop layer and a etch back process is performed to remove the insulating material 208 at the bottom of the polygonal trench 101 (i.e. the bottom of the opening 209') and the insulating layer 203 underlying the bottom of the polygonal trench 101 (See FIG. 3C), and a contact hole 209 is thereby formed which exposes an upper surface of the first semiconductor layer 202 (as shown in FIG. 3D). The etch back process may also remove the insulating material 208 on the first dielectric layer 206. The etch back process makes the contact hole 209 extend downwardly passing through the insulating layer 203 and expose the upper surface of the first semiconductor layer 202. Then, a doping process (for example, a ion implantation process) is performed to form a doping area 210 under the exposed surface of the first semiconductor layer 202. Then, an annealing process is performed to activate dopants of the doping area 210. After the annealing process, the resistance of the doping area 210 is reduced. Therefore, the doping area 210 can be electrically connected to the top-side contact structure which is subsequently formed. In the embodiment, the doping area 210 has the same conductivity type as the first semiconductor layer 202.

Figure 3E:
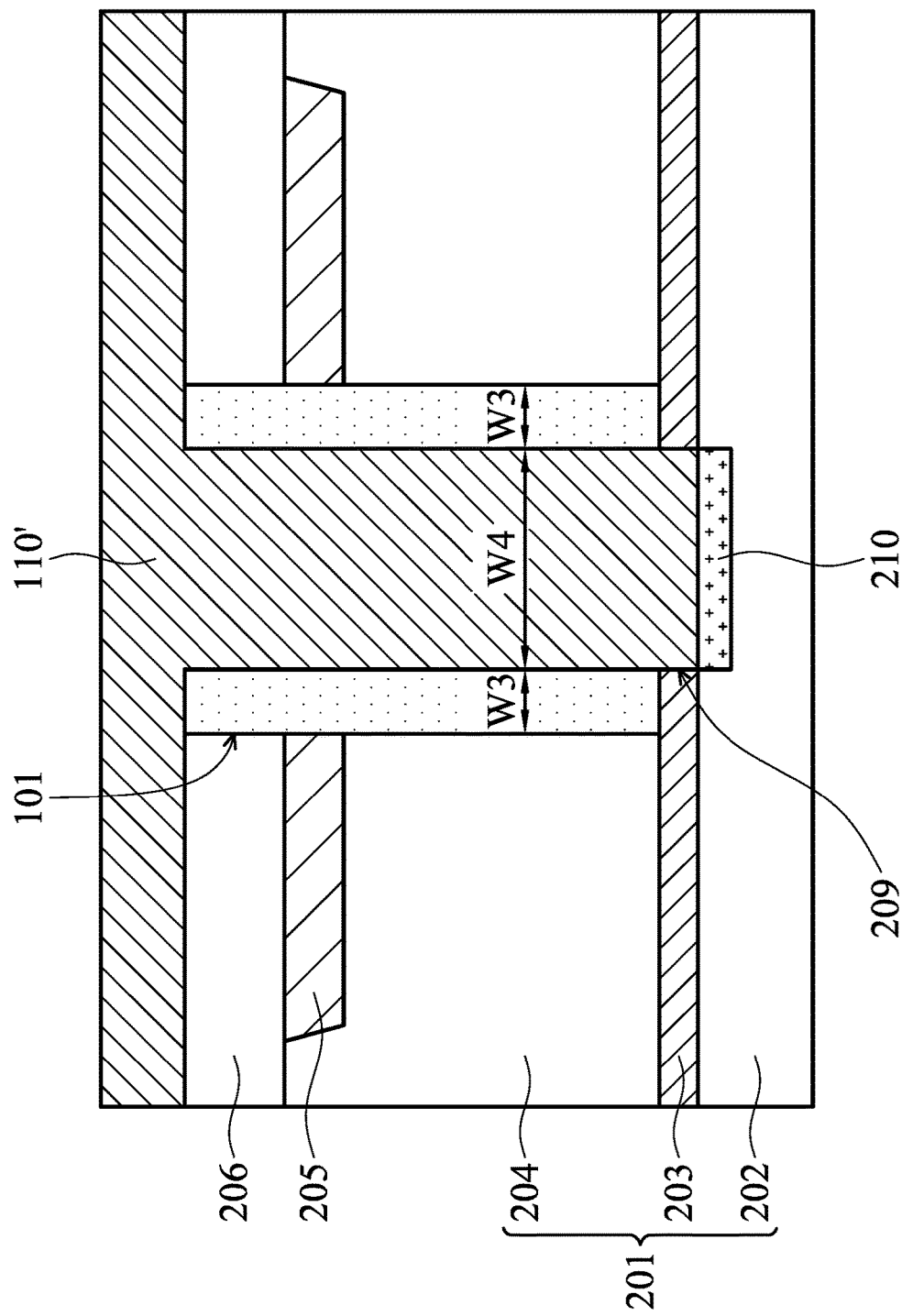

Referring to FIG. 3E, a conductive material 110' is formed on the first dielectric layer 206 and the insulating material 208 by a deposition process (for example, a physical vapor deposition process, a chemical vapor deposition process or another suitable process), and the conductive material 110' fills the polygonal trench 101 and the contact hole 209. In some embodiments, the conductive material 110' may include W, Po or another suitable conductive material.

Figure 3F:
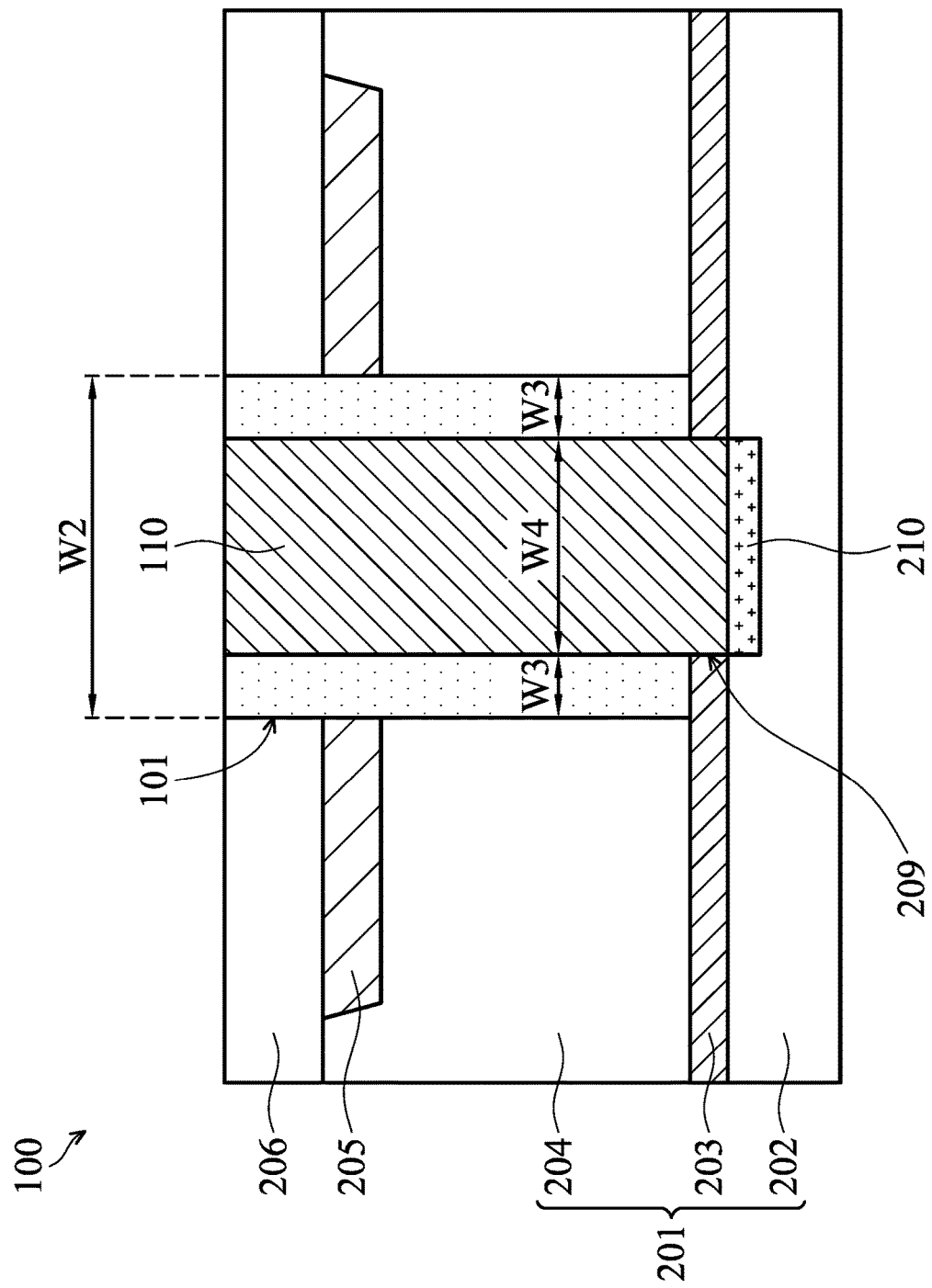

Referring to FIG. 3F, the excess conducive material 110' located out of the polygonal trench 101 is removed by a planarization process (for example, a chemical mechanical polishing process) to form the polygon top-side contact structure 110. The polygon top-side contact structure 110 has a width W4 at the vertex of the polygon. In some embodiments, referring to FIG. 1 and FIG. 3F, a ratio W4:W2 of the width W4 of the polygon of the polygon top-side contact structure 110 at the vertices 102, 103, 104, 105 to the diagonal width W2 of the polygon of the polygonal trench 101 at the vertices 102, 103, 104, 105 is 3:7. The polygon top-side contact structure 110 penetrates the first dielectric layer 206, the shallow trench isolation structure 205, the second semiconductor layer 204 and the insulating layer 203, and is in direct contact with the first semiconductor layer 202 (or its doping area 210). The polygon top-side contact structure 110 is electrically connected to the doping area 210 in the first semiconductor layer 202, which is advantageous in applying ground voltage to the first semiconductor layer 202. Since the contact hole 209 is self-aligned at the center of the polygonal trench 101, the polygon top-side contact structure 110 filling the contact hole 209 can be self-aligned at the center of all sides and vertices of the polygonal trench 101. Namely, the polygon top-side contact structure 110 is surrounded by the insulating material 208.

Figure 3G:
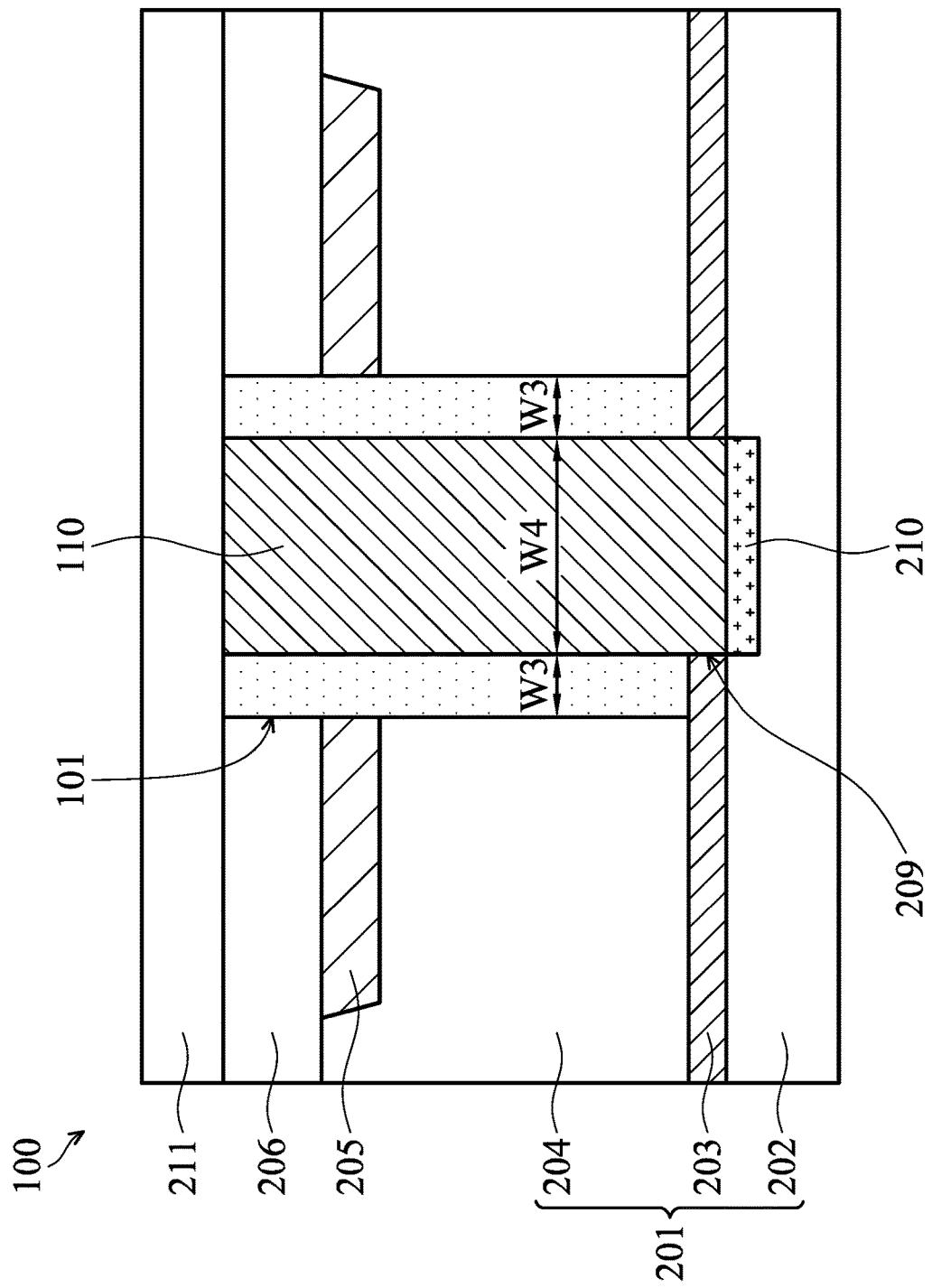

Referring to FIG. 3G, a second dielectric layer 211 (not shown in FIGS. 1-2) is formed on the first dielectric layer 206, the insulating material 208 and the polygon top-side contact structure 110 by a deposition process (for example, a physical vapor deposition process, a chemical vapor deposition process or another suitable process). In some embodiments, the second dielectric layer 211 may include oxide, nitride, oxynitride, carbide or another suitable dielectric material or a combination thereof.

Figure 3H:
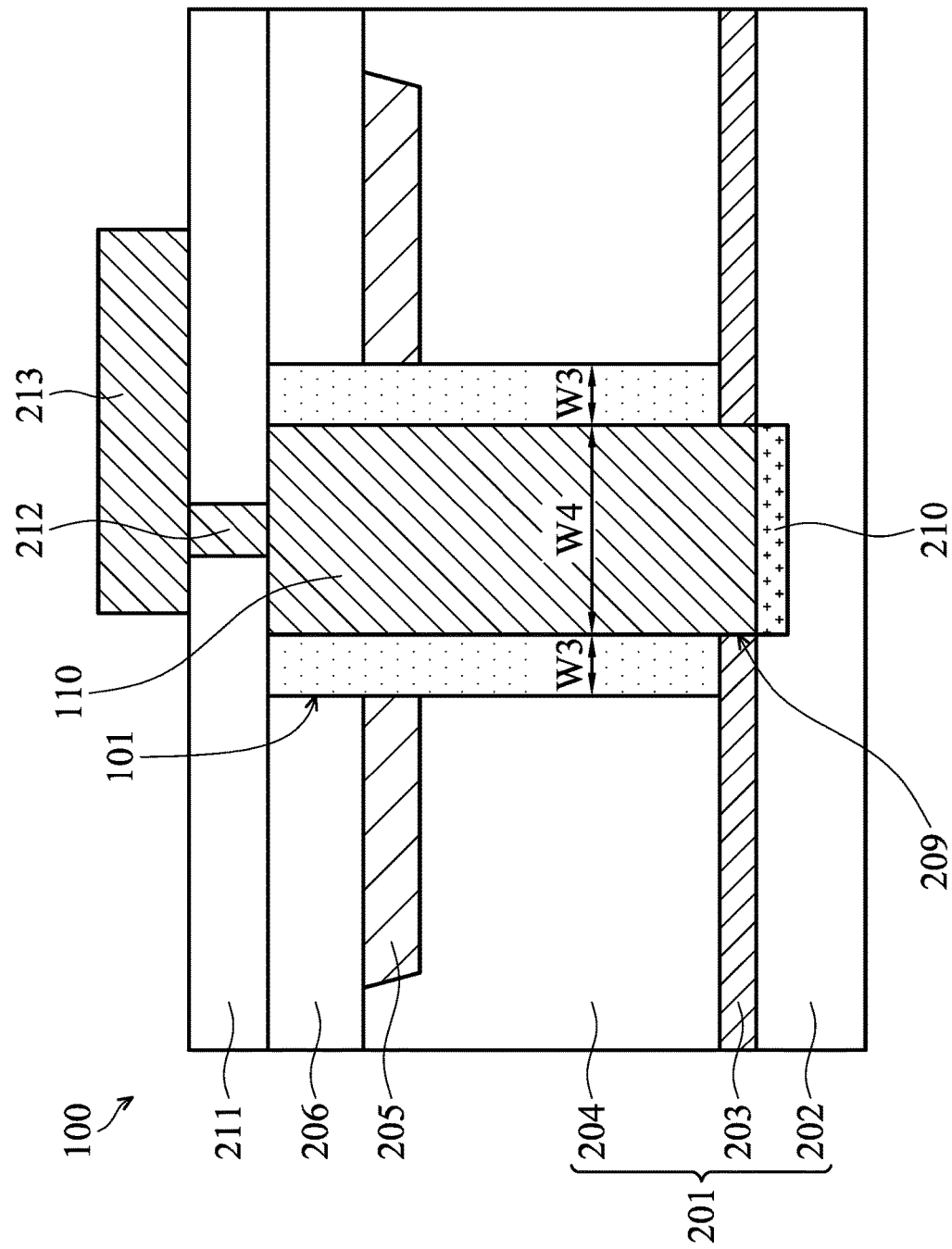

Referring to FIG. 3H, a hole penetrating the second dielectric layer 211 is formed in the second dielectric layer 211 at a location corresponding to the polygon top-side contact structure 110 (for example, the vertices of the polygon) by an etching process (for example, a dry-etching process, wet-etching process, plasma-etching process, reactive ion etching process or another suitable process). Then, the via 212 is formed by filling a conductive material into the hole and a metal layer 213 is formed on the second dielectric layer 211 by a deposition process, a lithography process and an etching process. The via 212 is in direct contact with the polygon top-side contact structure 110 and is electrically connected to the polygon top-side contact structure 110. The metal layer 213 is electrically connected to the via 212. The via 212 and the metal layer 213 are both located at the vertices of the polygon top-side contact structure 110. Therefore, the first semiconductor layer 202 can be electrically connected to external circuits by the polygon top-side contact structure 110, the via 212 and the metal layer 213. In some embodiments, the material of the via 212 and the metal layer 213 may include Ag, Cu or another suitable conductive material.

Figure 4:
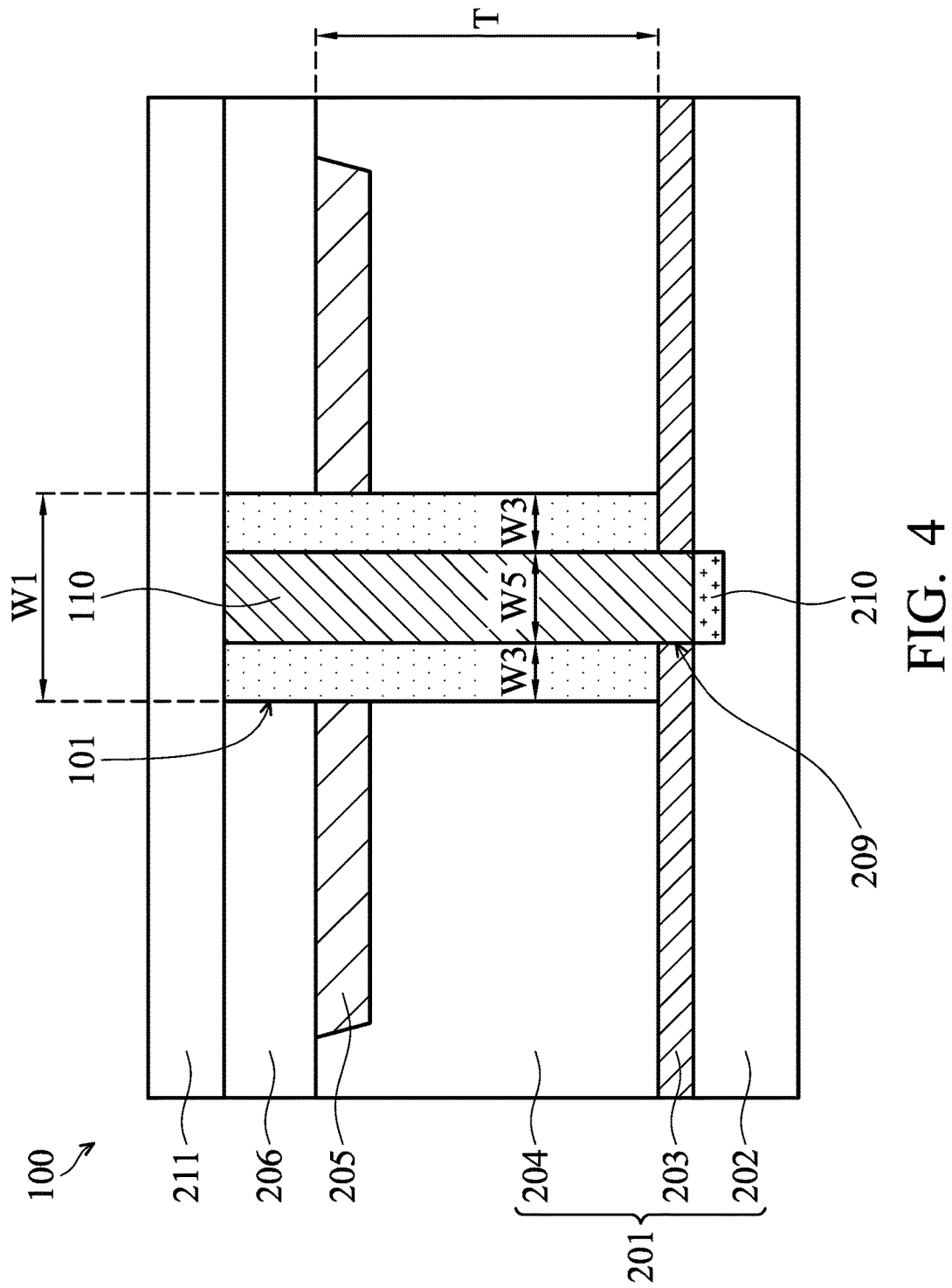
FIG. 4 shows a cross section of the trench isolation structure, along line B-B' shown in FIG. 2, according to some embodiments of the disclosure.

FIG. 4 shows a cross section of the trench isolation structure 100, along line B-B' shown in FIG. 2, according to some embodiments of the disclosure. Referring to FIG. 2 and FIG. 4, in some embodiments, the polygon top-side contact structure 110 has a width W5 at the first side 101a, the second side 101b, the third side 101c and the fourth side 101d of the polygonal trench 101. The second dielectric layer 211 (not shown in FIGS. 1-2) completely covers all sides of the polygon top-side contact structure 110, and there is no structure of the via 212 and the metal layer 213 disposed at the location directly above the sides of the polygon top-side contact structure 110. It can be understood from FIG. 2, FIG. 3H and FIG. 4 that the via 212 and the metal layer 213 are only formed at the location of the vertices of the polygonal trench 101 in some embodiments. In some embodiments, a ratio W5:W1 of the width W5 at a side of the polygon of the polygon top-side contact structure 110 to the side width W1 at the first side 101a, the second side 101b, the third side 101c and the fourth side 101d of the polygonal trench 101 is 1:5.

In the embodiment, the ratio T/W1 of the thickness T of the second semiconductor layer 204 to the side width W1 of the polygonal trench 101 is also an important parameter affecting the formation of the trench isolation structure 100. When the ratio T/W1 of the thickness T of the second semiconductor layer 204 to the side width W1 of the polygonal trench 101 is too great, control of the gap-filling ability of the insulating material 208 becomes more difficult. In other words, the thickness W3 of the insulating material 208 on the sidewalls of the polygonal trench 101 may not be uniform. If the thickness of the insulating material 208 on the sidewalls of the polygonal trench 101 is too thick, the insulating material 208 on the two opposite sidewalls may connect to each other, and therefore the contact hole 209 cannot be formed in the polygonal trench 101. On the other hand, if the thickness of the insulating material 208 on the sidewalls of the polygonal trench 101 is too thin, the insulating ability may be poor, and therefore undesired leakage current may occur. In addition, when the ratio T/W1 of the thickness T of the second semiconductor layer 204 to the side width W1 of the polygonal trench 101 is too great, the etching of the insulating material 208 on the bottom of the polygonal trench 101 and the insulating layer 203 underlying the bottom of the polygonal trench 101 becomes more difficult. As a result, the first semiconductor layer 202 may not be exposed, and the first semiconductor layer 202 cannot be electrically connected to the polygon top-side contact structure 110. In some embodiments, the thickness T of the second semiconductor layer 204 is 1 to 8 times the side width W1 of the polygonal trench 101 (i.e., the value of T/W1 is in a range from 1 to 8). In some embodiments, the thickness T of the second semiconductor layer 204 is 3 to 6 times the side width W1 of the polygonal trench 101 (i.e., the value of T/W1 is in a range from 3 to 6).

A conventional bottom-side contact structure is formed by forming a contact hole on the back side (i.e., the opposite side related to the front side where the devices are formed) of the substrate and then filling conductive material into the contact hole. In order to form the bottom-side contact structure, an additional protecting layer or dielectric layer must be formed on the back side of the substrate. Furthermore, in order to form an electrical contact point at the desired position, an additional photomask must be used for patterning the additional protecting layer or dielectric layer. Therefore, both the complexity of the process and the manufacturing cost of the bottom-side contact structure are quite high.

Moreover, a conventional top-side contact structure is formed by forming a contact hole on the front side (i.e., the side where the devices are formed) of the substrate and then filling conductive material into the contact hole. In the prior art, in order to form the top-side contact structure, an additional photomask is still necessary for defining the position of the contact hole. In addition, the top-side contact structure formed in the device region will occupy the effective area of the devices, which is disadvantageous for the miniaturization of the semiconductor device.

The disclosure provides a fabrication method of a trench isolation structure having a top-side contact structure. The fabrication method incorporates the processes of forming the top-side contact structure and a deep trench isolation structure. In comparison with conventional processes of the bottom-side contact structure or the top-side contact structure, the fabrication method of the trench isolation structure of the disclosure can use fewer photomasks and significantly reduce both the complexity of the process and the manufacturing cost. Furthermore, the top-side contact structure of the disclosure is formed in the deep trench isolation structure and does not occupy the effective area of the devices, which is advantageous for the miniaturization of the semiconductor devices.

According to some embodiments of the disclosure, since the trench isolation structure includes the polygon top-side contact structure, the bias coupling phenomenon caused by adjacent semiconductor elements can be prevented by grounding the polygon top-side contact structure. Namely, the effect of the bias coupling immune is achieved, and the semiconductor device can thereby have a higher figure of merit.

In addition, by controlling the deposition thickness of the insulating material (i.e., the ratio of the thickness of the insulating material to the width of the polygonal trench is maintained within a certain range), the polygonal trench of the trench isolation structure will not be completely filled with the insulating material. Therefore, the contact hole can be self-aligned to form at the center of the polygonal trench without using additional photomasks, and the polygon top contact structure filling the contact hole can be self-aligned to form in the center of all sides and vertices of the polygonal trench.

Moreover, by maintaining the ratio of the thickness of the second semiconductor layer in the substrate to the side width of the polygonal trench within a certain range, unevenness in the thickness of the insulating material filling the polygonal trench can be prevented, and the difficulty of the process of subsequently forming the polygon top-side contact structure can be effectively reduced.

The trench isolation structure and the methods for forming the same according to the embodiments of the disclosure can be applied to various low-voltage, high-voltage and extreme high-voltage elements such as a metal oxide semiconductor field effect transistor (MOSFET) and a high electron mobility transistor (HEMT), an insulated gate bipolar transistor (IGBT) etc.

While the disclosure has been described by way of example and in terms of the embodiments, it is to be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A trench isolation structure, comprising:
   a substrate, wherein the substrate comprises:
      a first semiconductor layer;
      an insulating layer disposed on the first semiconductor layer; and
      a second semiconductor layer disposed on the insulating layer, wherein the insulating layer is disposed between the first semiconductor layer and the second semiconductor layer;
   a polygonal trench disposed in the substrate;
   an insulating material disposed in the polygonal trench; and
   a polygon top-side contact structure disposed in the polygonal trench and surrounded by the insulating material, wherein the polygon top-side contact structure has the same shape as the polygonal trench from a top view, and the polygon top-side contact structure is electrically connected to and in direct contact with the first semiconductor layer, and the polygon top-side contact structure penetrates the second semiconductor layer and is in direct contact with the insulating material in the second semiconductor layer.

2. The trench isolation structure of claim 1, wherein the polygonal trench penetrates the second semiconductor layer, and the polygonal trench does not penetrate the first semiconductor layer and the insulating layer.

3. The trench isolation structure of claim 1, wherein a thickness of the second semiconductor layer is 3 times to 6 times the width of the polygonal trench.

4. The trench isolation structure of claim 1, wherein the polygon top-side contact structure penetrates the insulating layer and is in direct contact with a doped region of the first semiconductor layer.

5. The trench isolation structure of claim 1, further comprising:
   a shallow trench isolation structure disposed in the second semiconductor layer;
   a first dielectric layer disposed on the second semiconductor layer, wherein the polygonal trench penetrates the first dielectric layer and the shallow trench isolation structure, and the shallow trench isolation structure adjoins the first dielectric layer; and
   a second dielectric layer disposed on the first dielectric layer.

6. The trench isolation structure of claim 5, wherein the second dielectric layer completely covers every side of a polygon of the polygon top-side contact structure.

7. The trench isolation structure of claim 5, further comprising:
   a via formed in the second dielectric layer and electrically connected to the polygon top-side contact structure; and
   a metal layer disposed on the second dielectric layer and electrically connected to the via.

8. The trench isolation structure of claim 7, wherein the via is located at a vertex of a polygon of the polygon top-side contact structure.

9. The trench isolation structure of claim 1, wherein a material of the polygon top-side contact structure includes W or Po.

10. The trench isolation structure of claim 1, wherein a width at a vertex of a polygon of the polygon top-side contact structure is greater than a width at a side of the polygon of the polygon top-side contact structure.

11. The trench isolation structure of claim 1, wherein a thickness of the insulating material is greater than 1 µm, and the insulating material has a voltage resistance that is higher than 400V.

12. The trench isolation structure of claim 1, from a top view, further comprising:
   a trench protruding portion extended from a vertex of a polygon of the polygonal trench and along an extending direction of a side of the polygon of the polygonal trench to extend outwardly.

13. The trench isolation structure of claim 1, wherein a top surface of the polygon top-side contact structure and a top surface of the insulating material are coplanar, and a bottom surface of the polygon top-side contact structure is below a bottom surface of the insulating material.

14. A method for fabricating the trench isolation structure, comprising:
   providing the substrate, wherein the substrate comprises:
      the first semiconductor layer;
      the insulating layer disposed on the first semiconductor layer; and
      the second semiconductor layer disposed on the insulating layer, wherein the insulating layer is disposed between the first semiconductor layer and the second semiconductor layer;
   forming the polygonal trench in the substrate;
   forming the insulating material in the polygonal trench; and
   forming the polygon top-side contact structure in the polygonal trench and surrounded by the insulating material, wherein the polygon top-side contact structure has the same shape as the polygonal trench from a top view, and the polygon top-side contact structure is electrically connected to and in direct contact with the first semiconductor layer, and the polygon top-side contact structure penetrates the second semiconductor layer and is in direct contact with the insulating material in the second semiconductor layer.

15. The method of claim 14, wherein the step of forming the polygonal trench comprises:
   forming a patterned mask having an opening on the second semiconductor layer; and
   performing an etching process to the second semiconductor layer by using the patterned mask to form the polygonal trench in the second semiconductor layer at a location corresponding to the opening, wherein the polygonal trench penetrates the second semiconductor layer.

16. The method of claim 15, wherein the insulating material is conformally formed at a bottom and a sidewall of the polygonal trench.

17. The method of claim 16, wherein the step of forming the polygon top-side contact structure comprises:
   performing an etch back process to remove the insulating material at the bottom of the polygonal trench and the insulating layer underlying the bottom of the polygonal trench to form a contact hole exposing the first semiconductor layer; and filling a conductive material into the polygonal trench and the contact hole to form the polygon top-side contact structure.

18. The method of claim 15, further comprising:

forming a shallow trench isolation structure in the second semiconductor layer;

forming a first dielectric layer on the second semiconductor layer, wherein the polygonal trench penetrates the first dielectric layer and the shallow trench isolation structure, and the shallow trench isolation structure adjoins the first dielectric layer; and forming a second dielectric layer on the first dielectric layer.

19. The method of claim 18, further comprising:

forming a via in the second dielectric layer and electrically connected to the polygon top-side contact structure; and forming a metal layer on the second dielectric layer and electrically connected to the via.

\* \* \* \* \*